(12) United States Patent
Vitale

(10) Patent No.: US 12,316,932 B2
(45) Date of Patent: May 27, 2025

(54) ADJUSTABLE THERMAL SOLUTION

(71) Applicant: GoPro, Inc., San Mateo, CA (US)

(72) Inventor: Nicholas Vitale, Foster City, CA (US)

(73) Assignee: GoPro, Inc., San Mateo, CA (US)

( * ) Notice: Subject to any disclaimer, the term of this patent is extended or adjusted under 35 U.S.C. 154(b) by 138 days.

(21) Appl. No.: 18/233,107

(22) Filed: Aug. 11, 2023

(65) Prior Publication Data

US 2025/0056106 A1   Feb. 13, 2025

(51) Int. Cl.
| | | |
|---|---|---|
| H04N 23/52 | (2023.01) | |
| G03B 17/55 | (2021.01) | |
| H04N 23/62 | (2023.01) | |
| H04N 23/667 | (2023.01) | |
| H05K 7/20 | (2006.01) | |

(52) U.S. Cl.
CPC ............. *H04N 23/52* (2023.01); *G03B 17/55* (2013.01); *H04N 23/62* (2023.01); *H04N 23/667* (2023.01); *H05K 7/2039* (2013.01)

(58) Field of Classification Search
CPC ........ H04N 23/50; H04N 23/51; H04N 23/52; H04N 23/62; H04N 23/65; H04N 23/667; G03B 7/26; G03B 7/55; H05K 7/20209; H05K 7/2039
See application file for complete search history.

(56) References Cited

U.S. PATENT DOCUMENTS

| | | |
|---|---|---|
| 5,471,027 A | 11/1995 | Call |
| 6,097,598 A | 8/2000 | Miyahara |
| 7,329,869 B2 | 2/2008 | Cassel |
| 9,025,080 B2 | 5/2015 | Samuels |
| 9,860,970 B2 | 1/2018 | Tolbert |
| 9,910,342 B2 | 3/2018 | Samuels |
| 10,613,420 B2 | 4/2020 | Ali |
| 10,656,689 B2 | 5/2020 | Kilgore |
| 10,701,249 B1 | 6/2020 | Guo |

(Continued)

FOREIGN PATENT DOCUMENTS

| | | |
|---|---|---|
| CN | 110235059 A | 9/2019 |
| JP | 2004020798 A | 1/2004 |

(Continued)

OTHER PUBLICATIONS

International Preliminary Report on Patentability issued in App. No. PCT/US2021/019970, mailing date Sep. 9, 2022, 6 pages.

(Continued)

*Primary Examiner* — Daniel M Pasiewicz
(74) *Attorney, Agent, or Firm* — Young Basile Hanlon & MacFarlane, P.C.

(57) ABSTRACT

An image capture apparatus includes a heat sensitive assembly configured to support a battery. The image capture apparatus includes a heatsink spaced a distance from the heat sensitive assembly and a heat generating component that is spaced a distance from the heat sensitive assembly and the heatsink. The image capture apparatus includes a heat conductor that extends from the heat generating component to the heat sensitive assembly or the heatsink, and the heat conductor moves heat from the heat generating component to the heat sensitive assembly or the heatsink. The image capture apparatus includes an actuation mechanism that moves the heat conductor between the heat sensitive assembly and the heatsink.

20 Claims, 8 Drawing Sheets

(56) References Cited

U.S. PATENT DOCUMENTS

| | | |
|---|---|---|
| 11,146,711 B1 | 10/2021 | Crow |
| 11,277,545 B2 | 3/2022 | Crow |
| 11,637,949 B2 | 4/2023 | Crow |
| 11,689,790 B2 | 6/2023 | Nicholas |
| 11,838,608 B2 | 12/2023 | Crow |
| 2003/0128536 A1 | 7/2003 | Radu |
| 2003/0202328 A1 | 10/2003 | Deeney |
| 2004/0169771 A1 | 9/2004 | Washington |
| 2006/0100336 A1 | 5/2006 | Fukui |
| 2008/0056695 A1 | 3/2008 | Huang |
| 2008/0205881 A1 | 8/2008 | Sakurai |
| 2009/0274953 A1 | 11/2009 | Myers |
| 2010/0296805 A1 | 11/2010 | Mayer |
| 2011/0127912 A1 | 6/2011 | Lee |
| 2011/0194009 A1 | 8/2011 | Park |
| 2012/0035418 A1 | 2/2012 | Talbert |
| 2014/0055671 A1 | 2/2014 | Kawamura |
| 2014/0104479 A1 | 4/2014 | Samuels |
| 2014/0160284 A1 | 6/2014 | Achenbach |
| 2015/0049243 A1 | 2/2015 | Samuels |
| 2015/0365569 A1 | 12/2015 | Mai |
| 2016/0174408 A1 | 6/2016 | Tolbert |
| 2016/0334692 A1 | 11/2016 | Samuels |
| 2016/0349601 A1 | 12/2016 | Kungl |
| 2016/0374190 A1 | 12/2016 | Tolbert |
| 2017/0070652 A1 | 3/2017 | Müller |
| 2017/0156205 A1 | 6/2017 | Liu |
| 2017/0195531 A1 | 7/2017 | Warren |
| 2017/0195533 A1 | 7/2017 | Seo |
| 2017/0200992 A1 | 7/2017 | Piggott |
| 2017/0294694 A1 | 10/2017 | Tso |
| 2018/0107099 A1 | 4/2018 | Yasuda |
| 2018/0259831 A1 | 9/2018 | Chiu |
| 2019/0041600 A1 | 2/2019 | Sakamoto |
| 2019/0056643 A1 | 2/2019 | Chang |
| 2019/0163037 A1 | 5/2019 | Koyama |
| 2019/0346126 A1 | 11/2019 | Wada |
| 2020/0033774 A1 | 1/2020 | Shinji |
| 2020/0064533 A1 | 2/2020 | Miyazaki |
| 2020/0344395 A1 | 10/2020 | Guo |
| 2020/0351419 A1 | 11/2020 | Sharma |
| 2020/0413567 A1 | 12/2020 | Chusseau |
| 2021/0033815 A1 | 2/2021 | Lin |
| 2021/0122299 A1 | 4/2021 | Garcia |
| 2021/0272879 A1 | 9/2021 | Kubo |
| 2021/0274067 A1 | 9/2021 | Crow |
| 2021/0306536 A1 | 9/2021 | Nicholas |
| 2021/0321027 A1 | 10/2021 | Crow |
| 2021/0344819 A1 | 11/2021 | Nicholas |
| 2022/0021795 A1 | 1/2022 | Crow |
| 2022/0124226 A1 | 4/2022 | Jeong |
| 2022/0159148 A1 | 5/2022 | Crow |
| 2023/0009451 A1 | 1/2023 | Connolly |
| 2023/0232089 A1 | 7/2023 | Crow |
| 2023/0328345 A1 | 10/2023 | Nicholas |
| 2024/0073499 A1 | 2/2024 | Nicholas |
| 2024/0073500 A1 | 2/2024 | Nicholas |
| 2024/0073506 A1 | 2/2024 | Nicholas |
| 2024/0155255 A1 | 5/2024 | Griggs |
| 2024/0323532 A1* | 9/2024 | Abe .................. H04N 23/687 |

FOREIGN PATENT DOCUMENTS

| | | | |
|---|---|---|---|
| JP | 2006086752 A | | 3/2006 |
| JP | 2008015476 A | | 1/2008 |
| JP | 2009278584 A | * | 11/2009 |
| JP | 5322866 B2 | | 10/2013 |
| JP | 2017073634 A | | 4/2017 |

OTHER PUBLICATIONS

International Preliminary Report on Patentability issued in App. No. PCT/US2021/026140, mailing date Oct. 20, 2022, 8 pages.
International Search Report and Written Opinion for App. No. PCT/US2021/019970, dated Jun. 3, 2021, 9 pages.
International Search Report and Written Opinion for App. No. PCT/US2021/026140, dated Jul. 1, 2021, 10 pages.
U.S. Appl. No. 16/803,139, filed Feb. 27, 2020, Crow et al.

\* cited by examiner

ADJUSTABLE THERMAL SOLUTION

TECHNICAL FIELD

This disclosure relates to techniques and apparatuses for managing a temperature of a temperature sensitive component, such as a battery or an image sensor.

BACKGROUND

Modern cameras are designed to capture images and videos over long periods of time and in widely varying conditions. For example, many users desire to capture images and videos while skiing in the cold mountains, dirt biking in hot deserts, snorkeling on ocean floors, and hiking through hot landscapes. In each of these types of environments, the temperatures and conditions place a certain strain on temperature sensitive components in addition to normal strain of operation. For example, internal components, such as processors will generate heat such that the internal components of the camera should be arranged to manage overheating. However, overheating is not as much of an issue in cold environments and overheating can be exacerbated by current heat management systems in hot environments. Accordingly, techniques need to be developed so that a camera can extend performance in temperatures at both hot and cold extremes.

SUMMARY

Disclosed herein are implementations of an image capture apparatus.

In one implementation, an image capture apparatus includes a heat sensitive assembly configured to support a battery. The image capture apparatus includes a heatsink spaced a distance from the heat sensitive assembly and a heat generating component that is spaced a distance from the heat sensitive assembly and the heatsink. The image capture apparatus includes a heat conductor that extends from the heat generating component to the heat sensitive assembly or the heatsink, and the heat conductor moves heat from the heat generating component to the heat sensitive assembly or the heatsink. The image capture apparatus includes an actuation mechanism that moves the heat conductor between the heat sensitive assembly and the heatsink.

In some implementations, the image capture apparatus includes a housing that encloses the heat sensitive assembly, the heatsink, the heat generating component, the heat conductor and a portion of the actuation mechanism. The actuation mechanism may be controlled by one or more inputs through a screen, button, or switch of the housing. The actuation mechanism may be controlled by one or more mechanical inputs through a switch or button of the housing. The actuation mechanism may be integrated with a portion of the housing. The heat sensitive assembly and the heatsink may each include a thermal interface material where the heat conductor is contacts the heat sensitive assembly and the heatsink. The actuation mechanism may be separated from the heatsink and the heatsink. The actuation mechanism may be integrated with the heat sensitive assembly. The actuation mechanism may include a clip integrated with the heat sensitive assembly and connected with the heat conductor and a switch configured mechanically move the clip between contact with the heatsink and the heat sensitive assembly. The heat sensitive assembly may separate the heat generating component and the heatsink.

In another implementation, an image capture apparatus includes a heat sensitive assembly having first and second sides and a heatsink adjacent to the first side. The image capture apparatus includes a heat generating component adjacent to the second side and a heat conductor that extends along the first and second sides and is repositionable to thermally interface with the heatsink or the heat sensitive assembly.

In some implementations, the heat sensitive assembly may separate the heatsink and the heat generating component. The image capture device may include an actuation mechanism connected with the heat conductor that mechanically switches thermal interface of the heat conductor between the heatsink and the heat generating component. The heat generating component may include an image sensor or a system on a chip. The heat sensitive assembly may include an image sensor or battery.

In another implementation, an image capture apparatus includes a heat generating component and a heat sensitive assembly separated from the heat generating component. The image capture apparatus includes a heatsink separated from the heat generating and heat sensitive assemblys and an actuation mechanism switchable between a normal mode and a cold mode. The image capture apparatus includes a heat conductor that extends from the heat generating component to the actuation mechanism. The actuation mechanism is in a normal mode when the heat conductor is held in contact with the heatsink, and the actuation mechanism is in a cold mode when the heat conductor is held in contact with the heat sensitive assembly.

In some implementations, the actuation mechanism may further include a switch, slide, button, screen, or any combination thereof that control the normal and cold modes of the actuation mechanism. The heat generating component may include a processor or an image sensor. The heat sensitive assembly may include an image sensor or a battery. The image capture apparatus may include heatsink thermal interface material thermally coupling the heatsink and the heat conductor in the normal mode and a heat sensitive assembly thermal interface material thermally coupling the heat sensitive assembly and the heat conductor in the cold mode

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

The present disclosure provides a mechanism for moving a heat conductor between two different components so that energy from the inside of the image capture apparatus or external thereof can be effectively used to extend operation time of the image capture device. For example, a heat sensitive assembly (e.g., a battery or an image sensor) and a heatsink are each independently connectable to a heat conductor, and the heat conductor is affixed to a heat generating component (e.g., a processor, an image sensor, a circuit board, etc.). The heat conductor is movable between the heatsink and heat sensitive assembly, while remaining fixed to the heat generating component, based on the external environment of the image capture apparatus.

When the external temperature is cold (e.g., less than 25 degrees Celsius), the heat generating component is connectable to the heat sensitive assembly through the heat conductor so that operation time in the cold is extended by moving heat to the heat sensitive assembly, which is kept at a temperature acceptable to assist with capturing images. When the external temperature is warm (e.g., greater than 25 degrees Celsius), the heat generating component is connectable to the heatsink through the heat conductor so that operation time in warm climates is extended by moving heat to the heatsink, which keeps the heat sensitive assembly at a temperature acceptable to assist with capturing images. The user configures the management settings so that the temperatures is maintained within acceptable levels relative to exterior conditions, and the user can then use the image capture device for longer periods of time in extreme environments.

Figure 1A:
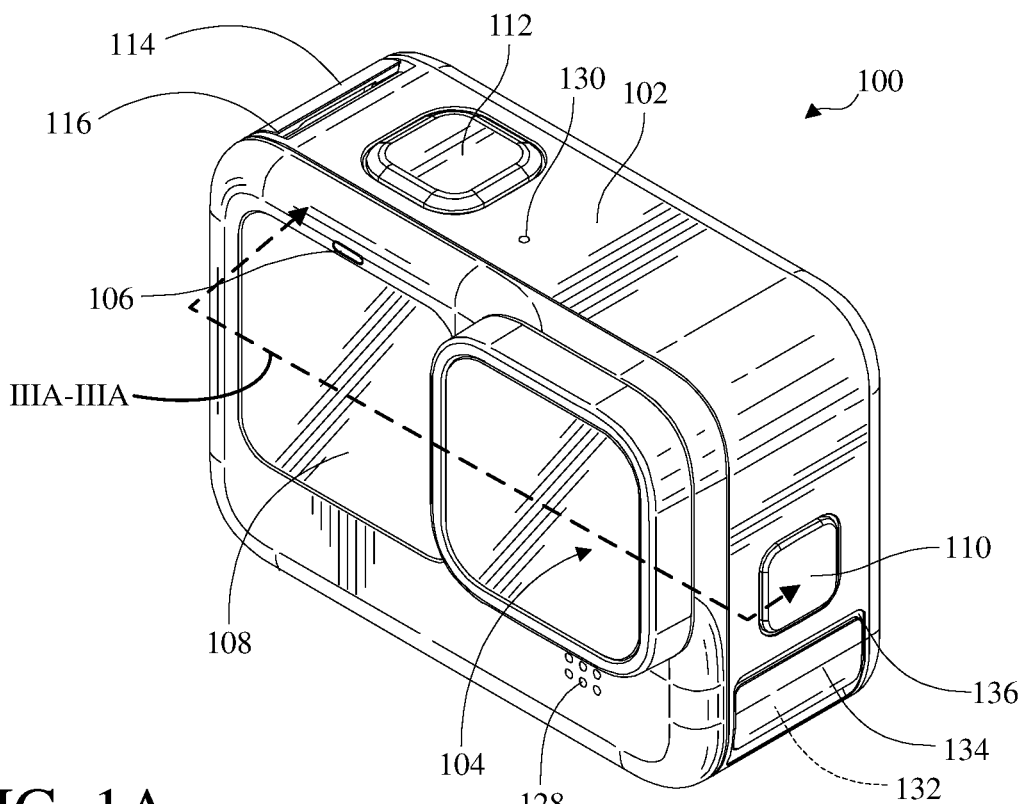
FIGS. 1A-1B are isometric views of an example of an image capture apparatus.
Figure 1B:
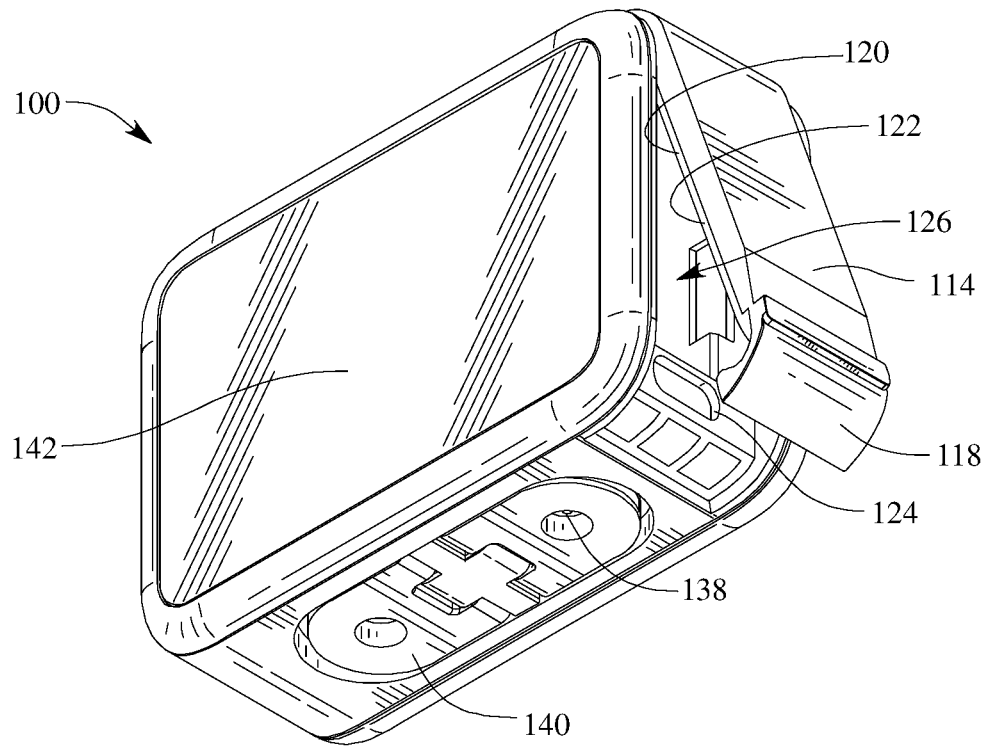
Figure 2:
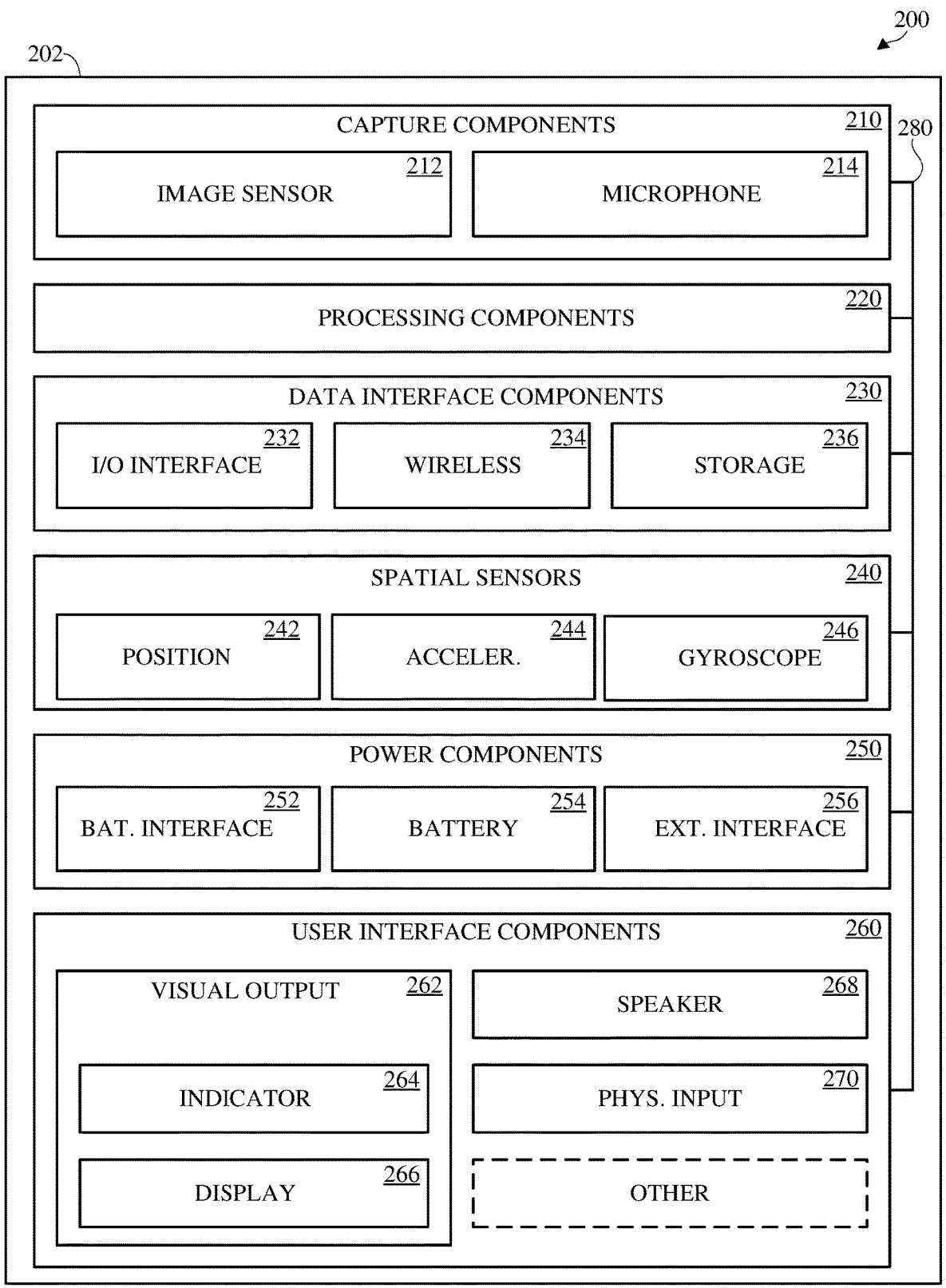
FIG. 2 is a block diagram of electronic components of an image capture apparatus.

FIGS. 1A-1B are isometric views of an example of an image capture apparatus 100. The image capture apparatus 100 includes a body 102, an image capture device 104, an indicator 106, a display 108, a mode button 110, a shutter button 112, a door 114, a hinge mechanism 116, a latch mechanism 118, a seal 120, a battery interface 122, a data interface 124, a battery receptacle 126, microphones 128, 130, 132, a speaker 138, an interconnect mechanism 140, and a display 142. Although not expressly shown in FIGS. 1A-1B, the image capture apparatus 100 includes internal electronics, such as imaging electronics, power electronics, and the like, internal to the body 102 for capturing images and performing other functions of the image capture apparatus 100. An example showing internal electronics is shown in FIG. 2. The arrangement of the components of the image capture apparatus 100 shown in FIGS. 1A-1B is an example, other arrangements of elements may be used, except as is described herein or as is otherwise clear from context.

The body 102 of the image capture apparatus 100 may be made of a rigid material such as plastic, aluminum, steel, or fiberglass. Other materials may be used. The image capture device 104 is structured on a front surface of, and within, the body 102. The image capture device 104 includes a lens. The lens of the image capture device 104 receives light incident upon the lens of the image capture device 104 and directs the received light onto an image sensor of the image capture device 104 internal to the body 102. The image capture apparatus 100 may capture one or more images, such as a sequence of images, such as video. The image capture apparatus 100 may store the captured images and video for subsequent display, playback, or transfer to an external device. Although one image capture device 104 is shown in FIG. 1A, the image capture apparatus 100 may include multiple image capture devices, which may be structured on respective surfaces of the body 102.

As shown in FIG. 1A, the image capture apparatus 100 includes the indicator 106 structured on the front surface of the body 102. The indicator 106 may output, or emit, visible light, such as to indicate a status of the image capture apparatus 100. For example, the indicator 106 may be a light-emitting diode (LED). Although one indicator 106 is shown in FIG. 1A, the image capture apparatus 100 may include multiple indictors structured on respective surfaces of the body 102.

As shown in FIG. 1A, the image capture apparatus 100 includes the display 108 structured on the front surface of the body 102. The display 108 outputs, such as presents or displays, such as by emitting visible light, information, such as to show image information such as image previews, live video capture, or status information such as battery life, camera mode, elapsed time, and the like. In some implementations, the display 108 may be an interactive display, which may receive, detect, or capture input, such as user input representing user interaction with the image capture apparatus 100. In some implementations, the display 108 may be omitted or combined with another component of the image capture apparatus 100.

As shown in FIG. 1A, the image capture apparatus 100 includes the mode button 110 structured on a side surface of the body 102. Although described as a button, the mode button 110 may be another type of input device, such as a switch, a toggle, a slider, or a dial. Although one mode button 110 is shown in FIG. 1A, the image capture apparatus 100 may include multiple mode, or configuration, buttons structured on respective surfaces of the body 102. In some implementations, the mode button 110 may be omitted or combined with another component of the image capture apparatus 100. For example, the display 108 may be an interactive, such as touchscreen, display, and the mode button 110 may be physically omitted and functionally combined with the display 108.

As shown in FIG. 1A, the image capture apparatus 100 includes the shutter button 112 structured on a top surface of the body 102. The shutter button 112 may be another type of input device, such as a switch, a toggle, a slider, or a dial. The image capture apparatus 100 may include multiple shutter buttons structured on respective surfaces of the body 102. In some implementations, the shutter button 112 may be omitted or combined with another component of the image capture apparatus 100.

The mode button 110, the shutter button 112, or both, obtain input data, such as user input data in accordance with user interaction with the image capture apparatus 100. For example, the mode button 110, the shutter button 112, or both, may be used to turn the image capture apparatus 100 on and off, scroll through modes and settings, and select modes and change settings.

As shown in FIG. 1B, the image capture apparatus 100 includes the door 114 coupled to the body 102, such as using the hinge mechanism 116 (FIG. 1A). The door 114 may be secured to the body 102 using the latch mechanism 118 that releasably engages the body 102 at a position generally opposite the hinge mechanism 116. The door 114 includes the seal 120 and the battery interface 122. Although one door 114 is shown in FIG. 1A, the image capture apparatus 100 may include multiple doors respectively forming respective surfaces of the body 102, or portions thereof. The door 114 may be removable from the body 102 by releasing the latch mechanism 118 from the body 102 and decoupling the hinge mechanism 116 from the body 102.

In FIG. 1B, the door 114 is shown in a partially open position such that the data interface 124 is accessible for communicating with external devices and the battery receptacle 126 is accessible for placement or replacement of a battery. In FIG. 1A, the door 114 is shown in a closed position. In implementations in which the door 114 is in the closed position, the seal 120 engages a flange (not shown) to provide an environmental seal and the battery interface 122 engages the battery (not shown) to secure the battery in the battery receptacle 126.

As shown in FIG. 1B, the image capture apparatus 100 includes the battery receptacle 126 structured to form a portion of an interior surface of the body 102. The battery receptacle 126 includes operative connections for power transfer between the battery and the image capture apparatus 100. In some implementations, the battery receptable 126 may be omitted. The image capture apparatus 100 may include multiple battery receptacles.

As shown in FIG. 1A, the image capture apparatus 100 includes a first microphone 128 structured on a front surface of the body 102, a second microphone 130 structured on a top surface of the body 102, and a third microphone 132 structured on a side surface of the body 102. The third microphone 132, which may be referred to as a drain microphone and is indicated as hidden in dotted line, is located behind a drain cover 134, surrounded by a drain channel 136, and can drain liquid from audio components of the image capture apparatus 100. The image capture apparatus 100 may include other microphones on other surfaces of the body 102. The microphones 128, 130, 132 receive and record audio, such as in conjunction with capturing video or separate from capturing video. In some implementations, one or more of the microphones 128, 130, 132 may be omitted or combined with other components of the image capture apparatus 100.

As shown in FIG. 1B, the image capture apparatus 100 includes the speaker 138 structured on a bottom surface of the body 102. The speaker 138 outputs or presents audio, such as by playing back recorded audio or emitting sounds associated with notifications. The image capture apparatus 100 may include multiple speakers structured on respective surfaces of the body 102.

As shown in FIG. 1B, the image capture apparatus 100 includes the interconnect mechanism 140 structured on a bottom surface of the body 102. The interconnect mechanism 140 removably connects the image capture apparatus 100 to an external structure, such as a handle grip, another mount, or a securing device. The interconnect mechanism 140 includes folding protrusions configured to move between a nested or collapsed position as shown in FIG. 1B and an extended or open position. The folding protrusions of the interconnect mechanism 140 in the extended or open position may be coupled to reciprocal protrusions of other devices such as handle grips, mounts, clips, or like devices.

The image capture apparatus 100 may include multiple interconnect mechanisms structured on, or forming a portion of, respective surfaces of the body 102. In some implementations, the interconnect mechanism 140 may be omitted.

As shown in FIG. 1B, the image capture apparatus 100 includes the display 142 structured on, and forming a portion of, a rear surface of the body 102. The display 142 outputs, such as presents or displays, such as by emitting visible light, data, such as to show image information such as image previews, live video capture, or status information such as battery life, camera mode, elapsed time, and the like. In some implementations, the display 142 may be an interactive display, which may receive, detect, or capture input, such as user input representing user interaction with the image capture apparatus 100. The image capture apparatus 100 may include multiple displays structured on respective surfaces of the body 102, such as the displays 108, 142 shown in FIGS. 1A-1B. In some implementations, the display 142 may be omitted or combined with another component of the image capture apparatus 100.

The image capture apparatus 100 may include features or components other than those described herein, such as other buttons or interface features. In some implementations, interchangeable lenses, cold shoes, and hot shoes, or a combination thereof, may be coupled to or combined with the image capture apparatus 100. For example, the image capture apparatus 100 may communicate with an external device, such as an external user interface device, via a wired or wireless computing communication link, such as via the data interface 124. The computing communication link may be a direct computing communication link or an indirect computing communication link, such as a link including another device or a network, such as the Internet. The image capture apparatus 100 may transmit images to the external device via the computing communication link.

The external device may store, process, display, or combination thereof, the images. The external user interface device may be a computing device, such as a smartphone, a tablet computer, a smart watch, a portable computer, personal computing device, or another device or combination of devices configured to receive user input, communicate information with the image capture apparatus 100 via the computing communication link, or receive user input and communicate information with the image capture apparatus 100 via the computing communication link. The external user interface device may implement or execute one or more applications to manage or control the image capture apparatus 100. For example, the external user interface device may include an application for controlling camera configuration, video acquisition, video display, or any other configurable or controllable aspect of the image capture apparatus 100. In some implementations, the external user interface device may generate and share, such as via a cloud-based or social media service, one or more images or video clips. In some implementations, the external user interface device may display unprocessed or minimally processed images or video captured by the image capture apparatus 100 contemporaneously with capturing the images or video by the image capture apparatus 100, such as for shot framing or live preview.

FIG. 2 is a block diagram of electronic components in an image capture apparatus 200. The image capture apparatus 200 may be a single-lens image capture device, a multi-lens image capture device, or variations thereof, including an image capture apparatus with multiple capabilities such as the use of interchangeable integrated sensor lens assemblies. Components, such as electronic components, of the image capture apparatus 100 shown in FIGS. 1A-1B may be implemented as shown in FIG. 2.

The image capture apparatus 200 includes a body 202. The body 202 may be similar to the body 102 shown in FIGS. 1A-1B, the body 202 shown in FIGS. 2A-2B, or the housing 402 shown in FIGS. 4A-4B. The body 202 includes electronic components such as capture components 210, processing components 220, data interface components 230, spatial sensors 240, power components 250, user interface components 260, and a bus 280.

The capture components 210 include an image sensor 212 for capturing images. Although one image sensor 212 is shown in FIG. 2, the capture components 210 may include multiple image sensors. The image sensor 212 may be similar to the image sensors 342, 346 shown in FIG. 3. The image sensor 212 may be, for example, a charge-coupled device (CCD) sensor, an active pixel sensor (APS), a complementary metal-oxide-semiconductor (CMOS) sensor, or an N-type metal-oxide semiconductor (NMOS) sensor. The image sensor 212 detects light, such as within a defined spectrum, such as the visible light spectrum or the infrared spectrum, incident through a corresponding lens. The image sensor 212 captures detected light as image data and conveys the captured image data as electrical signals (image signals or image data) to the other components of the image capture apparatus 200, such as to the processing components 220, such as via the bus 280.

The capture components 210 include a microphone 214 for capturing audio. Although one microphone 214 is shown in FIG. 2, the capture components 210 may include multiple microphones. The microphone 214 detects and captures, or records, sound, such as sound waves incident upon the microphone 214. The microphone 214 may detect, capture, or record sound in conjunction with capturing images by the image sensor 212. The microphone 214 may detect sound to receive audible commands to control the image capture apparatus 200. The microphone 214 may be similar to the microphones 128, 130, 132 shown in FIGS. 1A-1B.

The processing components 220 perform image signal processing, such as filtering, tone mapping, or stitching, to generate, or obtain, processed images, or processed image data, based on image data obtained from the image sensor 212. The processing components 220 may include one or more processors having single or multiple processing cores. In some implementations, the processing components 220 may include, or may be, an application specific integrated circuit (ASIC) or a digital signal processor (DSP). For example, the processing components 220 may include a custom image signal processor. The processing components 220 conveys data, such as processed image data, with other components of the image capture apparatus 200 via the bus 280. In some implementations, the processing components 220 may include an encoder, such as an image or video encoder that may encode, decode, or both, the image data, such as for compression coding, transcoding, or a combination thereof.

Although not shown expressly in FIG. 2, the processing components 220 may include memory, such as a random-access memory (RAM) device, which may be non-transitory computer-readable memory. The memory of the processing components 220 may include executable instructions and data that can be accessed by the processing components 220.

The data interface components 230 communicates with other, such as external, electronic devices, such as a remote control, a smartphone, a tablet computer, a laptop computer, a desktop computer, or an external computer storage device. For example, the data interface components 230 may receive commands to operate the image capture apparatus 200. In another example, the data interface components 230 may transmit image data to transfer the image data to other electronic devices. The data interface components 230 may be configured for wired communication, wireless communication, or both. As shown, the data interface components 230 include an I/O interface 232, a wireless data interface 234, and a storage interface 236. In some implementations, one or more of the I/O interface 232, the wireless data interface 234, or the storage interface 236 may be omitted or combined.

The I/O interface 232 may send, receive, or both, wired electronic communications signals. For example, the I/O interface 232 may be a universal serial bus (USB) interface, such as USB type-C interface, a high-definition multimedia interface (HDMI), a FireWire interface, a digital video interface link, a display port interface link, a Video Electronics Standards Associated (VESA) digital display interface link, an Ethernet link, or a Thunderbolt link. Although one I/O interface 232 is shown in FIG. 2, the data interface components 230 include multiple I/O interfaces. The I/O interface 232 may be similar to the data interface 124 shown in FIG. 1B.

The wireless data interface 234 may send, receive, or both, wireless electronic communications signals. The wireless data interface 234 may be a Bluetooth interface, a ZigBee interface, a Wi-Fi interface, an infrared link, a cellular link, a near field communications (NFC) link, or an Advanced Network Technology interoperability (ANT+) link. Although one wireless data interface 234 is shown in FIG. 2, the data interface components 230 include multiple wireless data interfaces. The wireless data interface 234 may be similar to the data interface 124 shown in FIG. 1B.

The storage interface 236 may include a memory card connector, such as a memory card receptacle, configured to receive and operatively couple to a removable storage device, such as a memory card, and to transfer, such as read, write, or both, data between the image capture apparatus 200 and the memory card, such as for storing images, recorded audio, or both captured by the image capture apparatus 200 on the memory card. Although one storage interface 236 is shown in FIG. 2, the data interface components 230 include multiple storage interfaces. The storage interface 236 may be similar to the data interface 124 shown in FIG. 1B.

The spatial, or spatiotemporal, sensors 240 detect the spatial position, movement, or both, of the image capture apparatus 200. As shown in FIG. 2, the spatial sensors 240 include a position sensor 242, an accelerometer 244, and a gyroscope 246. The position sensor 242, which may be a global positioning system (GPS) sensor, may determine a geospatial position of the image capture apparatus 200, which may include obtaining, such as by receiving, temporal data, such as via a GPS signal. The accelerometer 244, which may be a three-axis accelerometer, may measure linear motion, linear acceleration, or both of the image capture apparatus 200. The gyroscope 246, which may be a three-axis gyroscope, may measure rotational motion, such as a rate of rotation, of the image capture apparatus 200. In some implementations, the spatial sensors 240 may include other types of spatial sensors. In some implementations, one or more of the position sensor 242, the accelerometer 244, and the gyroscope 246 may be omitted or combined.

The power components 250 distribute electrical power to the components of the image capture apparatus 200 for operating the image capture apparatus 200. As shown in FIG. 2, the power components 250 include a battery interface 252, a battery 254, and an external power interface 256

(ext. interface). The battery interface 252 (bat. interface) operatively couples to the battery 254, such as via conductive contacts to transfer power from the battery 254 to the other electronic components of the image capture apparatus 200. The battery interface 252 may be similar to the battery receptacle 126 shown in FIG. 1B. The external power interface 256 obtains or receives power from an external source, such as a wall plug or external battery, and distributes the power to the components of the image capture apparatus 200, which may include distributing power to the battery 254 via the battery interface 252 to charge the battery 254. Although one battery interface 252, one battery 254, and one external power interface 256 are shown in FIG. 2, any number of battery interfaces, batteries, and external power interfaces may be used. In some implementations, one or more of the battery interface 252, the battery 254, and the external power interface 256 may be omitted or combined. For example, in some implementations, the external interface 256 and the I/O interface 232 may be combined.

The user interface components 260 receive input, such as user input, from a user of the image capture apparatus 200, output, such as display or present, information to a user, or both receive input and output information, such as in accordance with user interaction with the image capture apparatus 200.

As shown in FIG. 2, the user interface components 260 include visual output components 262 to visually communicate information, such as to present captured images. As shown, the visual output components 262 include an indicator 264 and a display 266. The indicator 264 may be similar to the indicator 106 shown in FIG. 1A. The display 266 may be similar to the display 108 shown in FIG. 1A, the display 142 shown in FIG. 1B. Although the visual output components 262 are shown in FIG. 2 as including one indicator 264, the visual output components 262 may include multiple indicators. Although the visual output components 262 are shown in FIG. 2 as including one display 266, the visual output components 262 may include multiple displays. In some implementations, one or more of the indicator 264 or the display 266 may be omitted or combined.

As shown in FIG. 2, the user interface components 260 include a speaker 268. The speaker 268 may be similar to the speaker 138 shown in FIG. 1B. Although one speaker 268 is shown in FIG. 2, the user interface components 260 may include multiple speakers. In some implementations, the speaker 268 may be omitted or combined with another component of the image capture apparatus 200, such as the microphone 214.

As shown in FIG. 2, the user interface components 260 include a physical input interface 270. The physical input interface 270 may be similar to the mode button 110 shown in FIG. 1A or the shutter button 112 shown in FIG. 1A. Although one physical input interface 270 is shown in FIG. 2, the user interface components 260 may include multiple physical input interfaces. In some implementations, the physical input interface 270 may be omitted or combined with another component of the image capture apparatus 200. The physical input interface 270 may be, for example, a button, a toggle, a switch, a dial, or a slider.

As shown in FIG. 2, the user interface components 260 include a broken line border box labeled "other" to indicate that components of the image capture apparatus 200 other than the components expressly shown as included in the user interface components 260 may be user interface components. For example, the microphone 214 may receive, or capture, and process audio signals to obtain input data, such as user input data corresponding to voice commands. In another example, the image sensor 212 may receive, or capture, and process image data to obtain input data, such as user input data corresponding to visible gesture commands. In another example, one or more of the spatial sensors 240, such as a combination of the accelerometer 244 and the gyroscope 246, may receive, or capture, and process motion data to obtain input data, such as user input data corresponding to motion gesture commands.

Figure 3A:
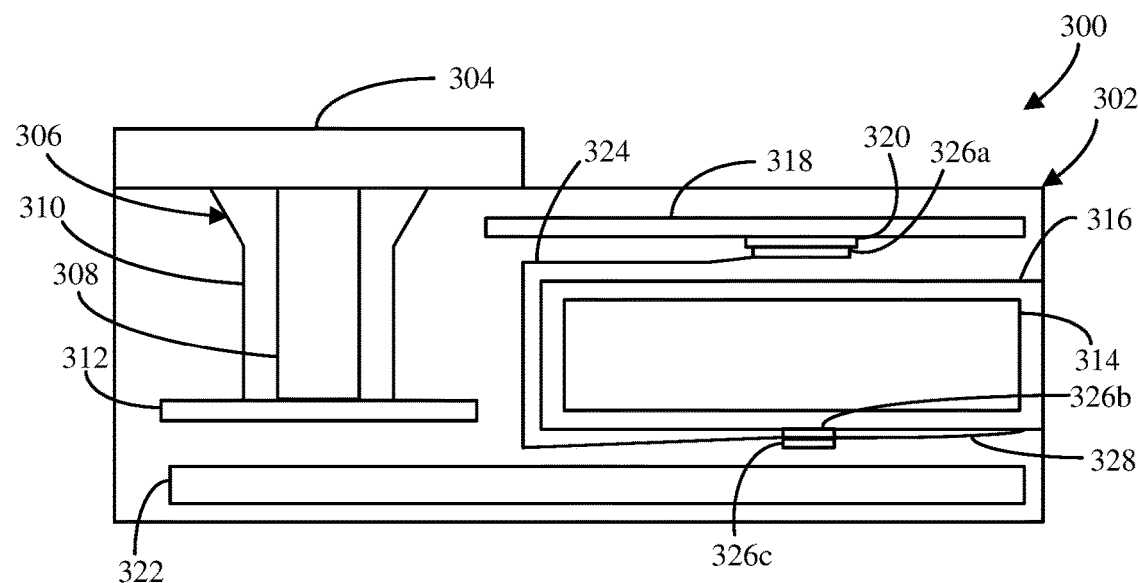
FIG. 3A is a cross-sectional view of the image capture apparatus of FIG. 1A along lines IIIA-IIIA.
Figure 3B:
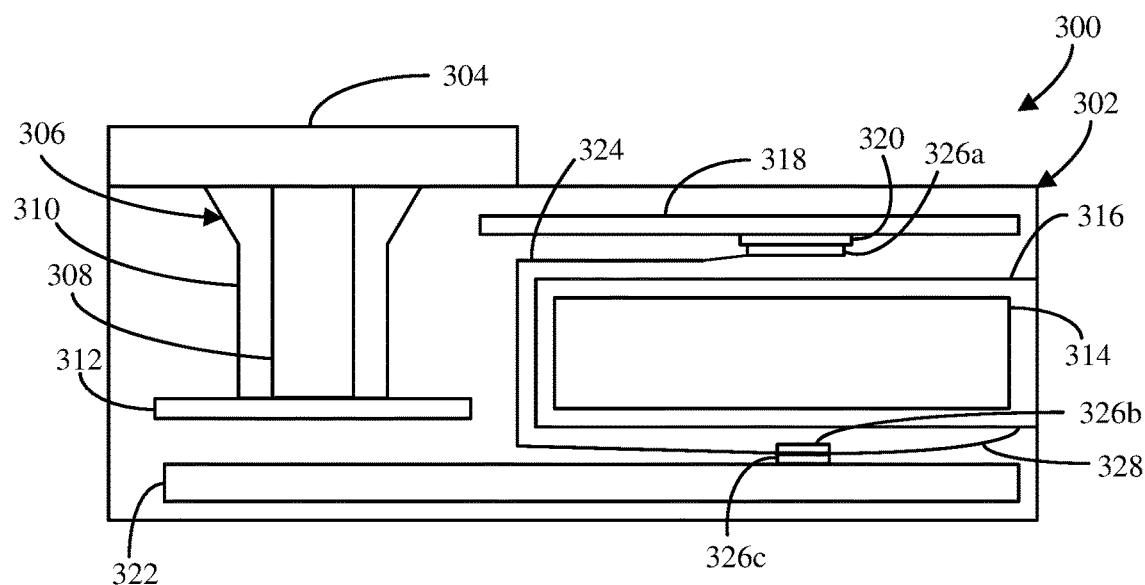
FIG. 3B is a cross-sectional view of the image capture apparatus of FIG. 1A along lines IIIA-IIIA in another configuration.

FIG. 3A is a cross-sectional view of the image capture apparatus 100 of FIG. 1A along lines IIIA-IIIA. FIG. 3B is a cross-sectional view of the image capture apparatus 100 of FIG. 1A along lines IIIA-IIIA in another configuration. For clarity, when describing FIGS. 3A and 3B, the image capture apparatus 100 will be referred to as an image capture apparatus 300. The image capture apparatus 300 comprises a housing 302 having a lens 304. Aligned with the lens 304, an image sensor assembly 306 includes an image sensor 308 surrounded by walls 310 and a circuit board 312. The image sensor 308 is configured to detect images. Adjacent to the image sensor assembly 306, a battery 314 is surrounded by a heat sensitive assembly 316, which may be referred to as a battery cage, that is configured to protect and thermally regulate the battery 314. The heat sensitive assembly 316 may be described as including the battery 314 and/or a battery cage that protects or thermally couples the battery 314 with other components. The heat sensitive assembly 316 and the battery 314 may be free of contact or connected by physical contact or through a thermal interface material configured to move heat to and from the battery 314.

The heat sensitive assembly 316 is positioned between a circuit board 318, which includes a heat generating component 320, and a heatsink 322 configured to absorb heat. The heat generating component 320 may be a processor or a system on a chip, for example, and is configured to connect with the heat sensitive assembly 316 or the heatsink 322 by a heat conductor 324 that moves heat from the heat generating component 320 to either the heat sensitive assembly 316 or the heatsink 322 depending on the mode of the image capture apparatus 300. At each point of contact between the heat conductor 324 and the heat sensitive assembly 316, the heat generating component 320, and the heatsink 322, thermal interface materials 326a, 326b, 326c are respectively positioned so that thermal contact is improved and heat is moved among the heat sensitive assembly 316, the heat generating component 320, and the heatsink 322.

The image capture device 300 has at least two modes-a cold mode and a normal mode. A user may manually switch between modes as desired, or the modes may automatically switch based on an environmental trigger from a sensor, weather data, and/or timed switch. The cold mode may be utilized at any temperature in which external temperatures will cool the battery 314 such that performance time of the image capture apparatus 300 is reduced. For example, the cold mode may be utilized when temperatures in an external environment are at or below ambient temperature (e.g., 25 degrees Celsius) by about 1 to 25 degrees Celsius. The normal mode may be utilized in any environment in which a component that generates heat, such as the image sensor 308 and/or heat generating component 320, is subject to overheating. For example, the normal mode may be utilized in any conditions where the image capture apparatus may be subject to temperatures that are ambient or above by about 1 to 35 degrees Celsius. In some examples, the normal mode may be utilized at a temperature that is below ambient depending on the needs of the heat generating component 320. In some examples, the image capture apparatus 300 may be configured to operate at another mode that switches the heat conductor 324 into contact with another component (e.g., the image sensor assembly 306 or another heat generating or accepting component) or out of contact with any or all of the heat sensitive assembly 316, the heat generating component 320, and/or the heatsink 322.

Comparing FIGS. 3A-3B, the heat conductor 324 is switchable in position between contact with the heatsink 322 and contact with the heat sensitive assembly 316 via the actuation mechanism 328. The actuation mechanism 328 is connected with the heat sensitive assembly 316 and configured to mechanically move the heat conductor 324 into and out of contact with the heatsink 322 and the heat sensitive assembly 316. The movement of the actuation mechanism 328 may be controlled by an external switch (e.g., switch 732 of FIG. 7A) so that the user can choose the mode of the image capture apparatus 300. In some examples, the actuation mechanism 328 is controlled by one or more software inputs that manually or automatically moves the actuation mechanism 428. For example, the actuation mechanism 328 may be controlled by an input entered by the user via one or more buttons or screens that are electronically connected with the actuation mechanism 328.

The actuation mechanism 328 may function to mechanically move the heat conductor 324 into and out of contact with the heatsink 322 and the heat sensitive assembly 316. By moving the actuation mechanism 328 between the heat conductor 324 between heat sensitive assembly 316 and the heatsink 322, the user can optionally decide which components to direct heat to inside of the housing 302, which extends operation time of the image capture apparatus 300. For example, by choosing to direct heat to the heatsink 322 in normal or warm conditions (i.e., in a normal mode, explained below), the user can direct heat from the heat generating component 320 to the heatsink 322 and avoid overheating of the image capture device 300. In other examples, by choosing to direct heat to the heat sensitive assembly 316 in cold conditions (i.e., in a cold mode, explained below), the user can direct heat from the heat generating component 320 to the battery 314 that may be negatively impacted by being cold, which can extend battery life in the image capture apparatus 300 despite cold conditions.

The actuation mechanism 328 may have any configuration sufficient to move the heat conductor 324 between components of the image capture apparatus 300. For example, the actuation mechanism 328 may be composed of a bendable material configured as a clip that is positioned to be moved such that a force is applied to either of the thermal interface materials 326a, 326b to increase thermal contact with either of the heat sensitive assembly 316 or the heatsink 322. The actuation mechanism 328 may be supported by one or more other components that are configured to force the actuation mechanism 328 to move. In some examples, the actuation mechanism 328 is connected with the housing 302, the heatsink 322, the heat sensitive assembly 316, or both. In some examples, the actuation mechanism 328 may be integrated with the heat conductor 324 and is not in contact with the housing 302, the heat sensitive assembly 316, and/or the heatsink 322 to simplify the arrangement of the image capture apparatus 300.

Figure 4A:
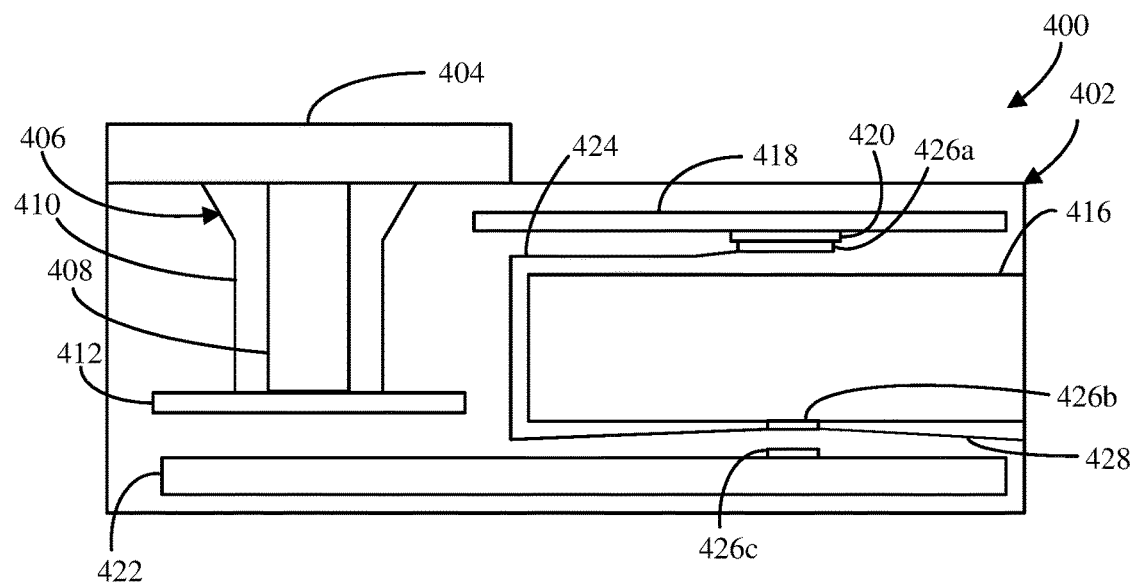
FIG. 4A is a cross-sectional view of the image capture apparatus of FIG. 1A along lines IIIA-IIIA.
Figure 4B:
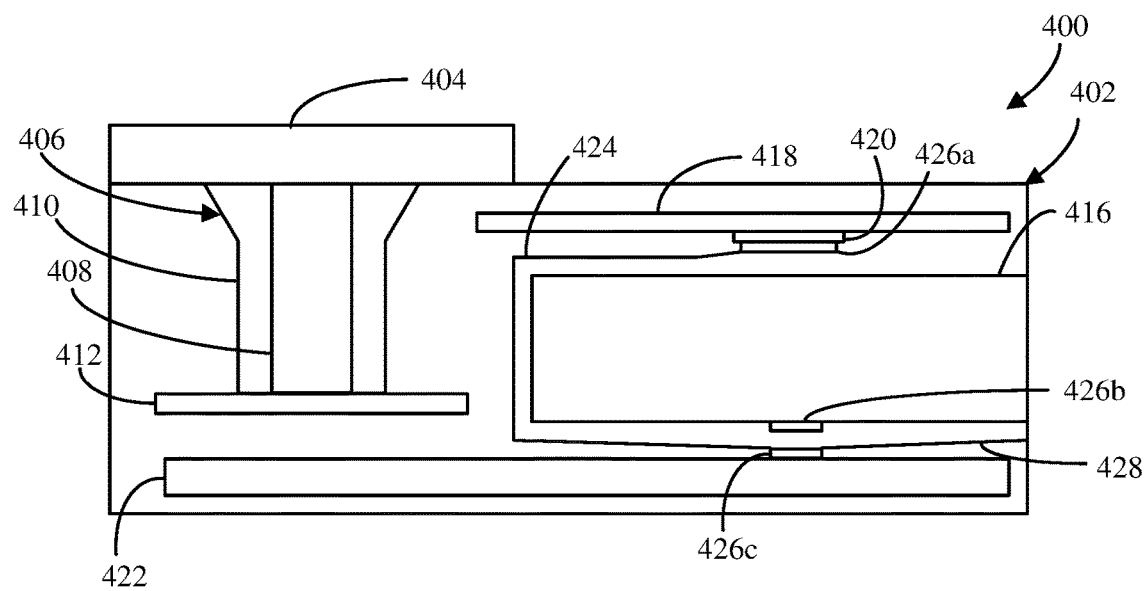
FIG. 4B is a cross-sectional view of the image capture apparatus of FIG. 1A along lines IIIA-IIIA in another configuration.

FIG. 4A is a cross-sectional view of the image capture apparatus 100 of FIG. 1A along lines IIIA-IIIA. FIG. 4B is a cross-sectional view of the image capture apparatus 100 of FIG. 1A along lines IIIA-IIIA in another configuration. For clarity, when describing FIGS. 4A and 4B, the image capture apparatus 100 will be referred to as an image capture apparatus 400. The image capture apparatus 400 includes a housing 402, lens 404, and an image sensor assembly 406. The image sensor assembly 406 includes an image sensor 408, walls 410, and a circuit board 412, which may be similar to the image sensor 308, walls 310, and circuit board 312 of FIGS. 3A-3B. The image capture apparatus 400 includes a heat sensitive assembly 416 and a circuit board 418 having a processor 420 that is connected with a heatsink 422 through a heat conductor 424. The heat sensitive assembly 416, the circuit board 418, the heat generating component 420, the heatsink 422, and the heat conductor 424 may be similar to the heat sensitive assembly 316, the circuit board 318, the heat generating component 320, the heatsink 322, and the heat conductor 324 of FIGS. 3A-3B. At the point of contact between the heat conductor 424 and the heat sensitive assembly 416, the heat generating component 420, and the heatsink 422, thermal interface materials 426a, 426b, 426c are included which improve the thermal connection between the components and which may be similar to the thermal interface materials 326a, 326b, 326c of FIGS. 3A-3B.

FIGS. 4A-4B illustrate an actuation mechanism 428 that is separated from the heat sensitive assembly 416 and connected with the housing 402. The actuation mechanism 428 may be similar to the actuation mechanism 328 of FIGS. 3A-3B. The actuation mechanism 428 connects with the housing 402 and actuates back and forth between forcing the heat conductor 424 into contact with either of the thermal interface materials 426b, 426c.

The heat conductor 424 functions to thermally connect two or more components so that operation time of the image capture apparatus 400 can be extended. The heat conductor 424 may connect with any number of components, for example, two or more, three or more, four or more, five or more, or a plurality of components. The heat conductor 424 may be fixedly connected with one or more components while being removably connectable with two or more other components so that thermal loads can be managed among components with different heat or cold tolerances. For example, the heat conductor 424 may be connectable with one or more heat sensitive assemblies (e.g., the image sensor 408 and/or the heat sensitive assembly 416 of FIGS. 4A-4B) when the external temperature is cold and connectable to the heatsink 422 when the external temperature is normal or warm. With this configuration, components that are sensitive to cold temperatures, such as a battery, may receive heat from one or more components when the external temperature is cold out and, hence, extend the operation time of the image capture apparatus 400. In other examples, where temperatures are warm or normal, the heat generating component 420 is subject to overheating, so the heat conductor 424 may connect the heat generating component 420 and the heatsink 422 so that operation times are extended due to dissipation of heat to the heatsink 422.

The heat conductor 424 may have a flexible structure so that the heat conductors 424 have moldability or bendability around one or more other components or obstructions that may be positioned between the heatsink 422 and the housing 402. The heat conductors 424 may connect with one or more intervening components (not shown) before or without further extending towards the heatsink 422 so that a pathway is established between the circuit boards 412, 418, the heat sensitive assembly 416, and the heatsinks 422. The heat conductor 424 may have a rigid structure the extends from the circuit boards 412, 418 to the heatsinks 422 and/or heat sensitive assembly 416 with minimal or no structural flexing, except by the actuation mechanism 428. In some examples, one or more other components (not shown) that are outside of the image sensor assembly 406 may anchor to the heat conductor 424 to prevent or mitigate movement of the one or more other components in the image capture apparatus 400. In some examples, the heat conductor 424 may have a portion that is rigid and a portion that is flexible so that the heat conductor 424 can combine structural support and allow navigation around one or more intervening components and one or both of the heatsinks 422. The heat conductors 424 may be composed of a material that is sufficient to have desirable heat transfer between the components and the heatsinks 422. For example, the heat conductors 424 may be composed of diamond, silver, copper, gold, aluminum, graphite, silicon carbide, aluminum nitride, tungsten, zinc, alloys thereof, or any combination thereof.

The heatsink 422 functions to dissipate heat from other components, such as the heat generating component 420. The heatsinks 422 may be positioned anywhere within the image capture apparatus 400 so that heat is dissipated throughout the inside of the image capture apparatus 400 as appropriate based on which setting (cold or normal modes) is desired. For example, the heatsinks 422 may be spaced a distance from the walls 410, the heat sensitive assembly 416, and/or the heat generating component 420, with or without an intervening component (not shown), so that heat is appropriately dissipated among the components through the heat conductor 424. The heatsinks 422 may be partially or fully integrated with an external wall of image capture apparatus 400 such that the at least one portion of the heatsink(s) 422 is exposed to an external environment outside of the image capture apparatus 400. The heatsink 422 may be an independent component or may be integrated or associated with another component of the image capture apparatus 400, such as a GPU, GPS, or any combination thereof.

The thermal interface materials 426a, 426b, 426c functions to thermally secure and/or couple the heat conductor 424 to one or more other components that generate heat (e.g., the circuit boards 312, 318, 412, 418, the heat generating component 320, 420 and/or the image sensors 308, 408 of FIGS. 3A-4B) or dissipate heat (e.g., heatsinks 322, 422 of FIGS. 3A-4B). The thermal interface materials 426a, 426b, 426c may be similar to the thermal interface materials 326a, 326b, 326c of FIGS. 3A-3B. The thermal interface materials 426a, 426b, 426c may have any physical configuration sufficient to increase or retain surface area between the heat conductor 424 and one or more other components without negatively impacting heat transfer capabilities or altering the position of each of the image sensor 408 and/or the heat generating component 420. The thermal interface materials 426a, 426b, 426c may have a configuration of a paste, a tape, a foam, or any combination thereof. The thermal interface materials 426a, 426b, 426c may be integrated or connected with the heat conductor 424 or may be integrated or connected with another component (e.g., the heat sensitive assembly 416 and/or the heatsink 722) such that the heat conductor 424 is movable or repositionable independent of the thermal interface materials 426a, 426b, 426c. In some examples, no thermal interface materials 426a, 426b may included with image capture apparatus 400 and the heat conductor 424 may move between positions and into contact with the heatsink 422 and the heat sensitive assembly 416 directly.

The thermal interface material 426a, 426b, 426c may have a degree of compressibility sufficient to keep a lateral surface of the heat conductor 424 in complete contact with either the heat sensitive assembly 416 or the heatsink 422. The degree of compressibility, which may be between 10 and 90 percent of rest, may be a measure of the compressibility of lateral sides of the thermal interface material 426a, 426b, 426c when a force is applied to either or both of the lateral sides relative to when the thermal interface material 426a, 426b, 426c are at rest. Having compressibility may be beneficial to retain high thermal contact between the components as the heat conductor 424 moves back and forth between components as the user changes the mode of the image capture apparatus 400 in response to external temperature conditions.

Figure 5A:
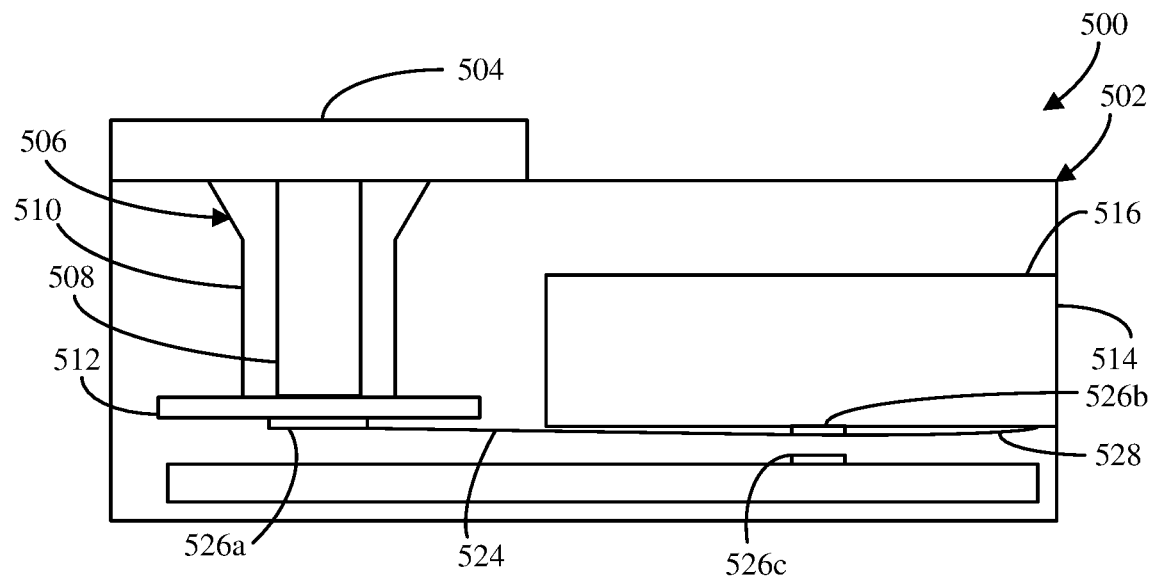
FIG. 5A is a cross-sectional view of the image capture apparatus of FIG. 1A along lines IIIA-IIIA.
Figure 5B:
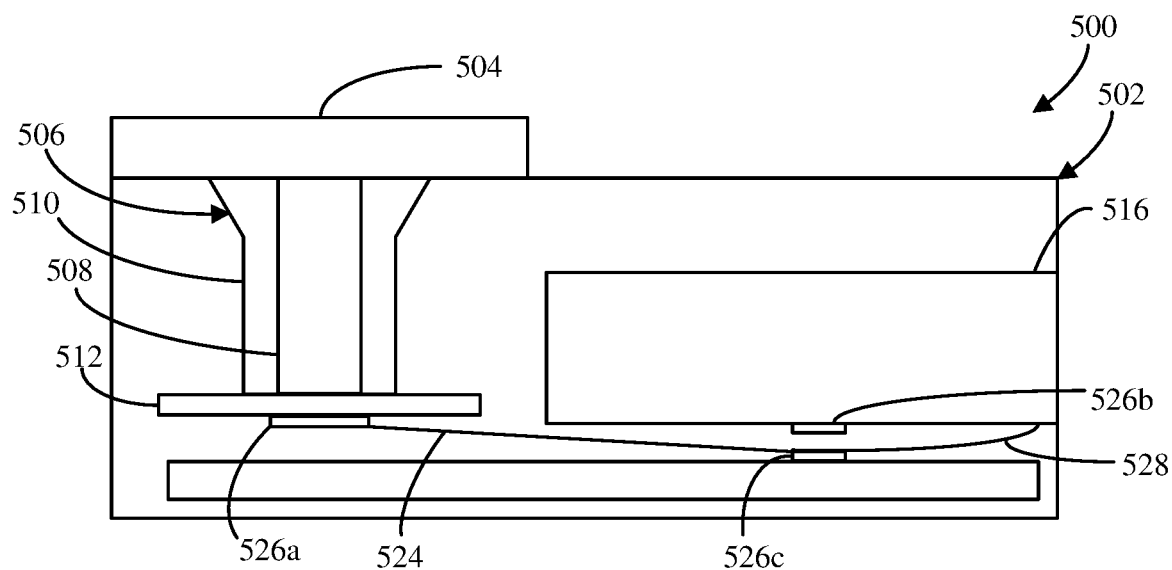
FIG. 5B is a cross-sectional view of the image capture apparatus of FIG. 1A along lines IIIA-IIIA in another configuration.

FIG. 5A is a cross-sectional view of the image capture apparatus 100 of FIG. 1A along lines IIIA-IIIA. FIG. 5B is a cross-sectional view of the image capture apparatus 100 of FIG. 1A along lines IIIA-IIIA in another configuration. For clarity, when describing FIGS. 5A and 5B, the image capture apparatus 100 will be referred to as an image capture apparatus 500. The image capture apparatus 500 includes a housing 502, lens 504, and an image sensor assembly 506. The image sensor assembly 506 includes an image sensor 508, walls 510, and a circuit board 512, which may be similar to the image sensors 308, 408, the walls 310, 410, and the circuit boards 312, 412 of FIGS. 3A-4B. The image capture apparatus 500 includes a heat sensitive assembly 516 configured to receive heat from the image sensor 508 and is adjacent to a heatsink 522. The heat sensitive assembly 516, the heatsink 522, and the heat conductor 524 may be similar to the heat sensitive assemblies 316, 416, the circuit boards 318, 418, the heat generating components 320, 420, the heatsinks 322, 422, and the heat conductors 324, 424 of FIGS. 3A-4B. At the point of contact between the heat conductor 524 and the heat sensitive assembly 516, the circuit board 512, and the heatsink 522, thermal interface materials 526a, 526b, 526c are included which improve the thermal connection between the components and which may be similar to the thermal interface materials 326a, 326b, 326c, 426a, 426b, 426c of FIGS. 3A-4B. An actuation mechanism 528, which may be similar to the actuation mechanism 328, 428 of FIGS. 3A-4B, is connected with the heat sensitive assembly 516 and configured to move the heat conductor 524 between the heatsink 522 and the heat sensitive assembly 516.

The image sensor 508 functions to detect images while operating the image capture apparatus. The image sensor 508 may be separated from other components by the walls 510 or the image sensor 508 may be exposed to other components such that the heat conductor 524 is directly connectable with the image sensor 508 or indirectly connectable through the thermal interface material 526a. The image sensor 508 may also be referred to as a heat sensitive assembly when the user desires to direct heat towards the image sensor 508 or a heat generating component when a user desires to direct heat away from the image sensor 508. In some examples, the heat conductor 524 is configured to switch between contacting the heat sensitive assembly 514, the image sensor 508, the heatsink 522, a heat generating component (such as a heat generating component 420 of FIGS. 4A-4B), or any combination thereof. For example, the image sensor 508 may generate heat and have a fixed connection with the heat conductor 524 that leads to a switchable connection between the heatsink 522 and a heat sensitive assembly 516. In other examples, the heatsink 522 is adjacent or proximate to the image sensor 508, and the heat conductor 524 is fixed to a heat generating component and switchable between the heatsink 522 and the image sensor 508.

The walls 510 function to protect the image sensor 508 from water and/or debris and to manage thermal loads on the image sensor 508. The walls 510 may have any configuration sufficient to enclose the image sensor 508 with or without the presence of the circuit board 512. The walls 510 may be composed of a material that is sufficiently rigid to structurally protect the image sensor 508, while retaining desirable thermal properties. The walls 510 may be composed of a material that has sufficient thermal conductivity to facilitate transfer of heat between the heat conductor 524 and the image sensor 508. For example, the walls 510 may be composed of a similar material as the heat conductor 524, the heatsink 522, or both. The walls 510 may have any configuration sufficient to connect with and/or house the circuit board 512 and/or image sensor 508. The walls 510 may be at least partially integrated with the image sensor 508, circuit board 512, and/or housing 502.

The circuit board 512 functions to electronically support the image sensor 508 (or a heat generating component 420 of FIG. 4A-4B). The circuit board 512 functions in part to dissipate heat from the image sensor 508 to the heat conductor 524. The circuit boards 512 may be similar to the circuit boards 312, 412, 318, 418 of FIGS. 3A-4B. The circuit boards 512 may be configured to direct heat from the image sensor 810 to the heat conductor 524 that is located on the peripheral edge of the circuit boards 512 or substantial center of the circuit boards 512. Specifically, for example, the circuit boards 512 may have a trenched configuration that directs heat in a lateral direction towards the peripheral edges, which may be advantageous if the user desires to push heat towards the heat conductor 524. In other examples, the circuit boards 512 may have a vias configuration that directs heat in an axial direction, rather than a lateral direction, towards the heat conductor 524.

Figure 6A:
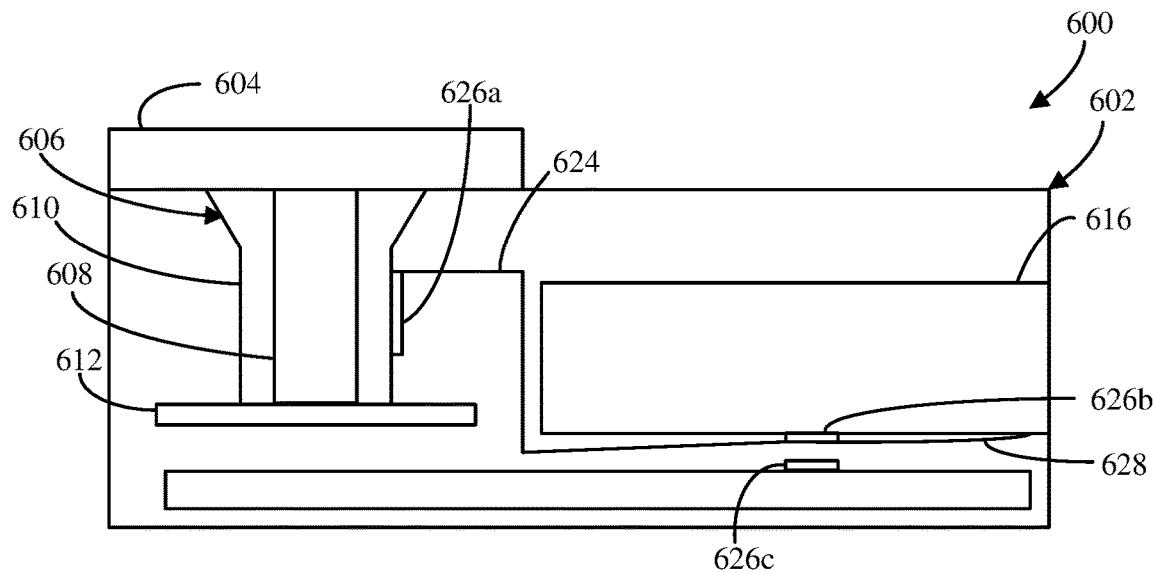
FIG. 6A is a cross-sectional view of the image capture apparatus of FIG. 1A along lines IIIA-IIIA.
Figure 6B:
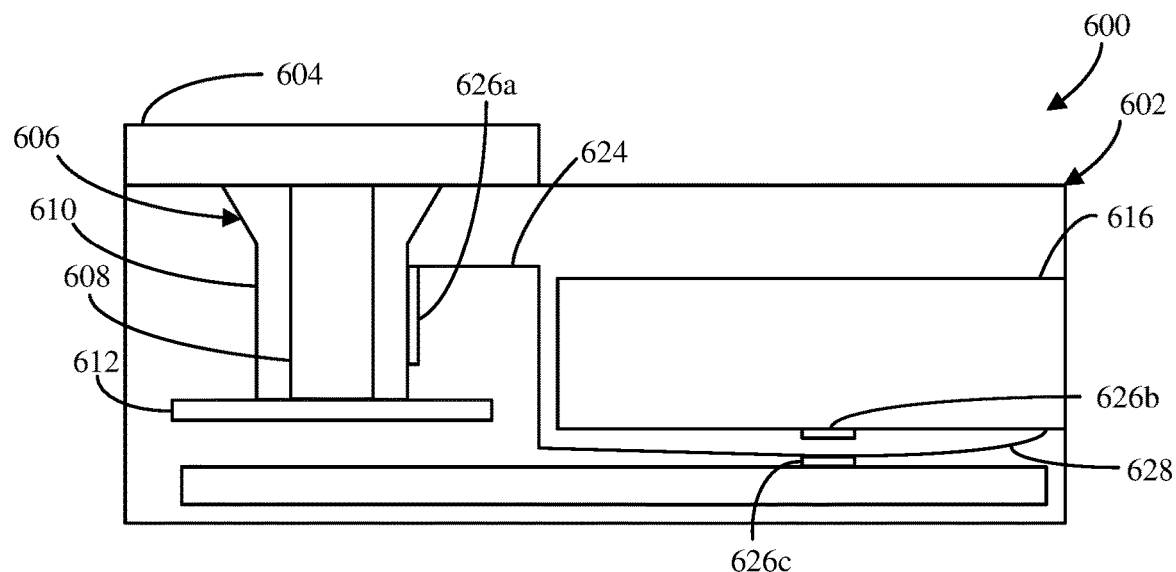
FIG. 6B is a cross-sectional view of the image capture apparatus of FIG. 1A along lines IIIA-IIIA in another configuration.

FIG. 6A is a cross-sectional view of the image capture apparatus 100 of FIG. 1A along lines IIIA-IIIA. FIG. 6B is a cross-sectional view of the image capture apparatus 100 of FIG. 1A along lines IIIA-IIIA in another configuration. For clarity, when describing FIGS. 6A and 6B, the image capture apparatus 100 will be referred to as an image capture apparatus 600. The image capture apparatus 600 includes a housing 602, lens 604, and an image sensor assembly 606. The image sensor assembly 606 includes an image sensor 608, walls 610, and a circuit board 612, which may be similar to the image sensors 308, 408, 508, the walls 310, 410, 510, and the circuit boards 312, 412, 512 of FIGS. 3A-5B. The image capture apparatus 600 includes a heat sensitive assembly 616 and a circuit board 618 having a heat generating component 620 that is connected with a heatsink 622 through a heat conductor 624. The heat sensitive assembly 616, the circuit board 618, the heat generating component 620, the heatsink 622, and the heat conductor 624 may be similar to the heat sensitive assemblies 316, 416, 516, the circuit boards 318, 418, the heat generating components 320, 420, the heatsinks 322, 422, 522, and the heat conductors 324, 424, 524 of FIGS. 3A-5B. At the point of contact between the heat conductor 624 and the heat sensitive assembly 616, the heat generating component 620, and the heatsink 622, thermal interface materials 626a, 626b, 626c are included which improve the thermal connection between the components and which may be similar to the thermal interface materials 326a, 326b, 326c, 426a, 426b, 426c, 526a, 526b, 526c of FIGS. 3A-5B. An actuation mechanism 628, which may be similar to the actuation mechanism 328, 428, 528 of FIGS. 3A-5B, is connected with the heat sensitive assembly 616 and configured to move the heat conductor 624 between the heatsink 622 and the heat sensitive assembly 616.

FIGS. 6A-6B illustrate the thermal interface material 626a and the heat conductor 624 contacting the image sensor assembly 606 at the wall 610 instead of the circuit board 612 (cf. FIGS. 6A-6B), which may improve dissipation of heat from the image sensor 608, depending on the configuration of the image sensor 608 within the walls 610. In other examples, the heat conductor 624 may interface with the image sensor assembly 606 at any location sufficient to transfer heat to or from the image sensor 608 to the appropriate heatsink 622 or heat sensitive assembly 616. In some examples, the thermal interface material 626a and heat conductor 624 may be contacting the image sensor assembly 606 at the opposing wall 610 or another location on the image sensor assembly 606 suited to transfer heat.

Figure 7A:
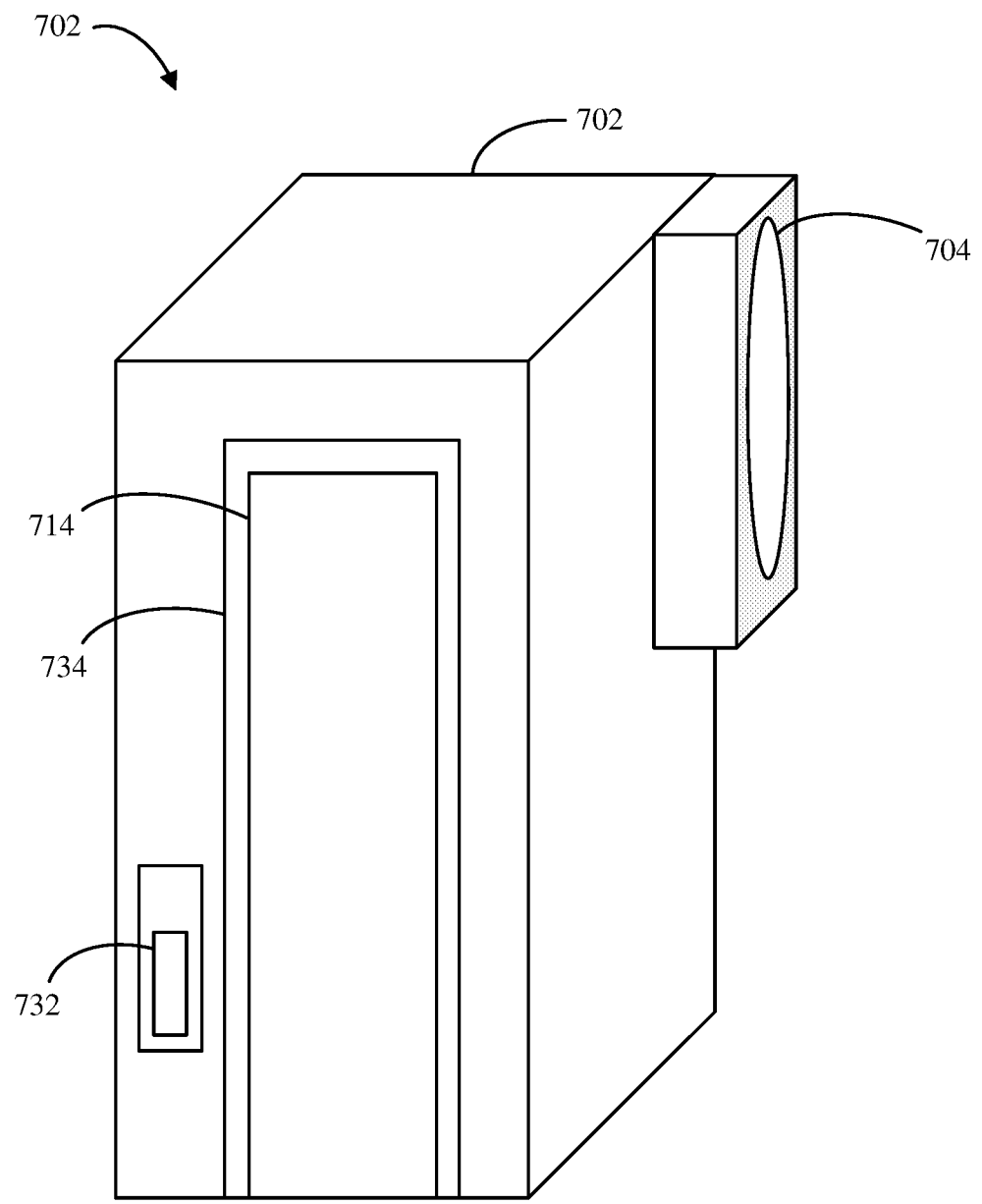
FIG. 7A is a perspective view of an image capture apparatus without a battery door.
Figure 7B:
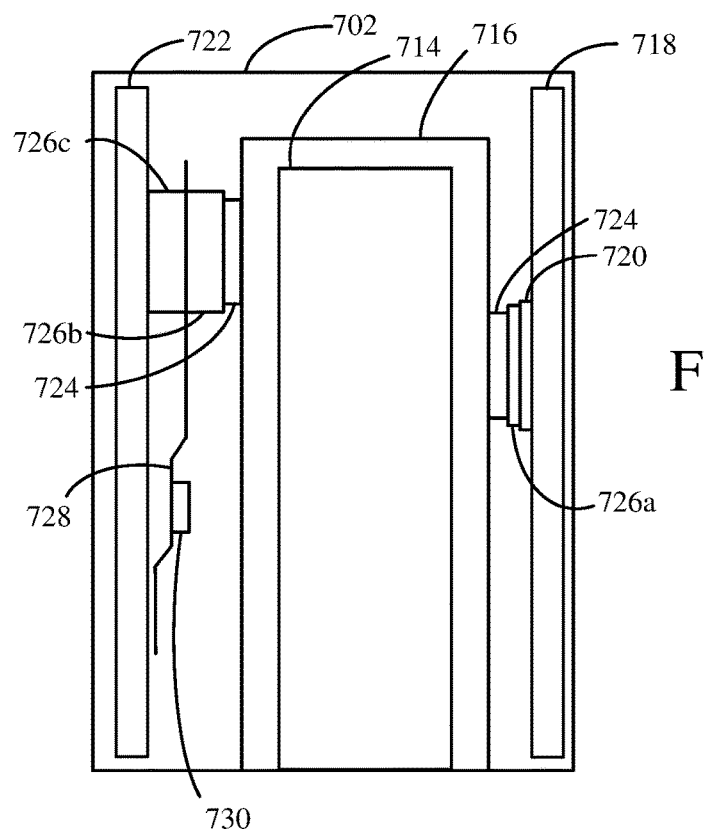
FIG. 7B is a cross-sectional view of the image capture apparatus of FIG. 7A along lines VIIA-VIA.
Figure 7C:
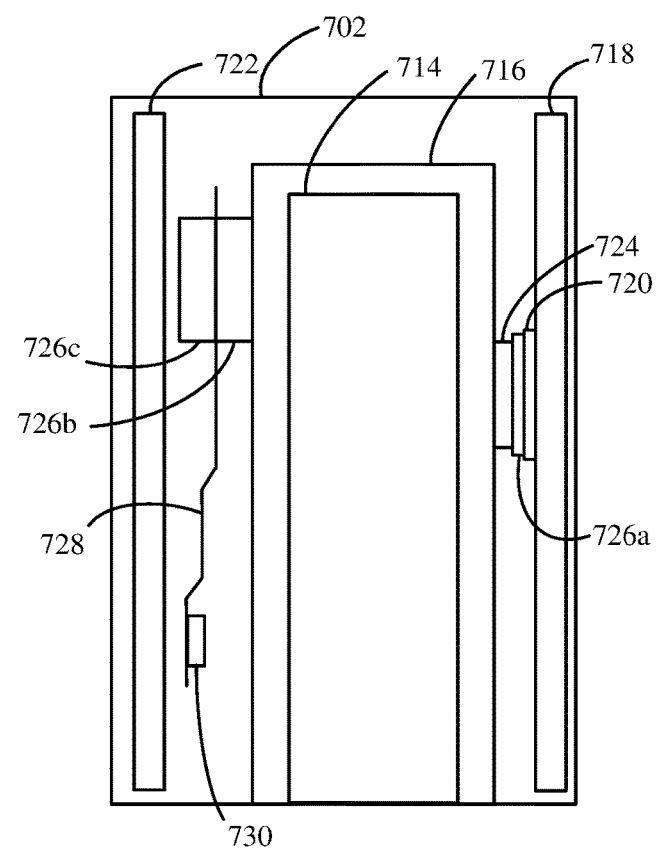
FIG. 7C is a cross-sectional view of the image capture apparatus of FIG. 1A along lines VIA-VIA.

FIG. 7A is a perspective view of an image capture apparatus 700 without a battery door (not shown, e.g., without the door 114 of FIG. 1B). FIG. 7B is a cross-sectional view of the image capture apparatus 700 of FIG. 7A along lines VIIA-VIA. FIG. 7C is a cross-sectional view of the image capture apparatus 700 of FIG. 1A along lines VIA-VIA. The image capture apparatus 700 includes a housing 702 and a lens 704, which may be similar to the housings 302, 402, 502, 602, the lenses 304, 404, 504, 604 of FIGS. 3A-6B, and the housing 702 encloses a battery 714 and a heat sensitive assembly 716 that is configured to protect the battery 714, which may be similar to the battery 314 of FIG. 3 and heat sensitive assemblies 316, 416, 516, 616 of FIGS. 3A-6B, from undesirable interactions with other components. The heat sensitive assembly 716 may be configured as walls (not shown) of an image sensor (not shown). The housing 702 additionally encloses a circuit board 718, a heat generating component 720, and a heatsink 722, which may be similar to the circuit boards 318, 418, 618, the heat generating components 320, 420, 620, and the heatsinks 322, 422, 522, 622 of FIGS. 3A-6B. A heat conductor 724 is configured to connect with each of the heat sensitive assembly 716, the heat generating component 720, and the heatsink 722 via thermal interface materials 726a, 726b, 726c, which may be similar to the conductors 324, 424, 524, 624 and thermal interface materials 326a, 326b, 326c, 426a, 426b, 426c, 526a, 526b, 526c, 626a, 626b, 626c of FIGS. 3A-6B.

To mechanically move the position of the heat conductor 724 between the heatsink 722 and the heat sensitive assembly 716, an actuation mechanism 728 is connected with the heat conductor 724 and configured to move the thermal interface materials 726a, 726b into and out of contact with the heatsink 722 and the heat sensitive assembly 716. Movement of the actuation mechanism 726 is controlled by an actuator 730 that is controllable by any means sufficient to mechanical move a component. In this example, the actuator 730 is connected with a switch 732 that is adjacent to an opening 734 for receiving the battery. Before the user enters his or her desired environment, the user can open the battery door (not shown) and insert the battery 714 into the opening 734, and at this time, decided whether to set the cold or normal modes by moving the actuation mechanism 728, which moves the actuator 730 and subsequently moves the position of the heat conductor 724. In other examples, the switch 732 is located on an external portion of the housing 702 that will not be covered by the battery door (not shown) when in use so the user can change the mode without opening the battery door, which may be beneficial when the image capture apparatus is included with an external housing accessory (not shown).

The actuation mechanism 728 extends from the heat sensitive assembly 716 (e.g., illustration in FIG. 3A) and into movable or repositionable contact with the heat sensitive assembly 716, and the actuation mechanism 728 has a bent and/or staggered configuration along the extended portion so that the actuator 730 can force movement of the heat conductor 724 by moving the actuation mechanism 728. When the actuator 730 is moved by the switch 732, the actuator 730 moves and/or slides along the extended portions that are bent and/or staggered such that the actuation mechanism 728 moves the heat conductor 724 to the appropriate location.

The actuation mechanism 728 may function to control the position of the heat conductor 724 relative to the heatsink 722 and the heat sensitive assembly 716. The actuation mechanism 728 may extend from any location within or be integrated with the image capture apparatus 700, such as from the housing 702, the heatsink 722, the heat sensitive assembly 716, a combination thereof, or any other internal component. The actuation mechanism 728 may have a configuration of a clip that is bent and configured to curve into one of the components and can be forced into another component by the actuator 730. In other examples, the actuation mechanism 728 is directly extends from the switch 732 or the like so an input changes the angle of extension of the actuation mechanism 728 and, hence, the location of the heat conductor 724.

The actuation mechanism 728 may be controlled by any component of the image capture apparatus 700, such as by switches, buttons, touch screens, voice activation, temperature activation, or any combination thereof. The actuation mechanism 728 may be automatic or manual. For example, an actuation mechanism 728 that is manual may be controlled by one or more inputs from a user (e.g., the switch 732 of FIG. 7A). In some examples, the actuation mechanism 728 that is automatic may be controlled by temperature activation (i.e., based on data from internal or external temperature sensors), altitude activation (i.e., by changes in altitude relative to sea level), humidity activation (i.e., separately or in combination with temperature sensors), or any combination thereof.

The switch 732 functions to control the position of the heat conductor 724 and the mode of the image capture apparatus 700. The switch 732 may be positioned on any location of the housing 702 that is accessible to the user. The switch 732 may be interfaceable with an external accessory (i.e., underwater housings, life jackets, selfie sticks, etc.) such that the user can control the mode of the image capture apparatus 700 through the external accessory. In some examples, the switch 732 is replaced with another component such as a touch screen and/or actuate-able button. In some examples, no switch 732 is included, and the switch 732 is replaced with an automatic activation means, as described herein.

FIGS. 7B-7C illustrate different positions of the actuator 730. For example, as the switch 732 is moved, the actuator 730 moves along bent portions of the actuation mechanism 728 and changes the position of the actuation mechanism 728 relative to the heatsink 722 and the heat sensitive assembly 716. In a first position (i.e., FIG. 7B), the actuator 730 forces the thermal interface material 726c and the heat conductor 724, which is illustrated is positioned a space away from the heat sensitive assembly 716, towards and into contact with the heatsink 722 to manage the thermal load in a cold mode. In a second position (i.e., FIG. 7C), the actuator 730 is slid down the actuation mechanism 728 and is no longer applying a force against the actuation mechanism 728 (e.g., FIG. 3A illustrates a rested position of the actuation mechanism 328) so that the actuation mechanism 728 bends into the heat sensitive assembly 716 moves the heat conductor 724 and the thermal interface material 726b towards and into contact with the heat sensitive assembly 716 in the cold mode. The actuation mechanism 728 may have any arrangement such that moving the switch 732 adjusts the position of the actuator 730 and adjusts the position of the heat conductor 724 to change between normal and cold modes.

The methods and techniques of an ADJUSTABLE THERMAL SOLUTION described herein, or aspects thereof, may be implemented by an image capture apparatus, or one or more components thereof, such as the image capture apparatus 100 shown in FIGS. 1A-1B, the image capture apparatus 200 shown in FIGS. 2A-2B, the image capture apparatus 300 shown in FIGS. 3A-3B, the image capture apparatus 400 shown in FIGS. 4A-4B, etc. The methods and techniques of an ADJUSTABLE THERMAL SOLUTION described herein, or aspects thereof, may be implemented by an image capture device, such as the image capture device 104 shown in FIGS. 1A-1B or one or more of the image capture devices 204, 206 shown in FIGS. 2A-2B.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. An image capture apparatus, comprising:
   a heat sensitive assembly configured to support a battery;
   a heatsink spaced a distance from the heat sensitive assembly;
   a heat generating component that is spaced a distance from the heat sensitive assembly and the heatsink;
   a heat conductor that extends from the heat generating component to the heat sensitive assembly or the heatsink, the heat conductor configured to move heat from the heat generating component to the heat sensitive assembly or the heatsink; and
   an actuation mechanism configured to move the heat conductor between contact with the heat sensitive assembly and the heatsink.

2. The image capture apparatus of claim 1, further comprising:
   a housing that encloses the heat sensitive assembly, the heatsink, the heat generating component, the heat conductor and a portion of the actuation mechanism.

3. The image capture apparatus of claim 2, wherein the actuation mechanism is controlled by one or more inputs through a screen, button, or switch of the housing.

4. The image capture apparatus of claim 2, wherein the actuation mechanism is controlled by one or more mechanical inputs through a switch or button of the housing.

5. The image capture apparatus of claim 4, wherein the actuation mechanism is integrated with a portion of the housing.

6. The image capture apparatus of claim 1, wherein the heat sensitive assembly and the heatsink each include a thermal interface material through which the heat conductor is configured to thermally interface with the heat sensitive assembly and the heatsink.

7. The image capture apparatus of claim 1, wherein the actuation mechanism is separated from the heatsink and the heatsink.

8. The image capture apparatus of claim 1, wherein actuation mechanism is integrated with the heat sensitive assembly.

9. The image capture apparatus of claim 8, wherein the actuation mechanism comprises:
   a clip integrated with the heat sensitive assembly and connected with the heat conductor; and
   a switch configured to mechanically move the clip between contact with the heatsink and the heat sensitive assembly.

10. The image capture apparatus of claim 1, wherein the heat sensitive assembly separates the heat generating component and the heatsink.

11. An image capture apparatus, comprising:
    a heat sensitive assembly having a first side and a second side;
    a heatsink adjacent to the first side;
    a heat generating component adjacent to the second side; and
    a heat conductor that extends along the first side and the second side and is repositionable to thermally interface with the heatsink or the heat sensitive assembly.

12. The image capture apparatus of claim 11, wherein the heat sensitive assembly separates the heatsink and the heat generating component.

13. The image capture apparatus of claim 12, further comprising:
    an actuation mechanism connected with the heat conductor and configured to mechanically switch thermal interface of the heat conductor between the heatsink and the heat generating component.

14. The image capture apparatus of claim 13, wherein the heat generating component comprises an image sensor or a system on a chip.

15. The image capture apparatus of claim 11, wherein the heat sensitive assembly is an image sensor or battery.

16. An image capture apparatus, comprising:
    a heat generating component;
    a heat sensitive assembly separated from the heat generating component;
    a heatsink separated from the heat generating component and the heat sensitive assembly;
    an actuation mechanism switchable between a normal mode and a cold mode; and
    a heat conductor that extends from the heat generating component to the actuation mechanism,
    wherein the actuation mechanism is in the normal mode when the heat conductor is held in contact with the heatsink, and
    wherein the actuation mechanism is in the cold mode when the heat conductor is held in contact with the heat sensitive assembly.

17. The image capture apparatus of claim 16, wherein the actuation mechanism comprises a switch, slide, button, screen, or any combination thereof that is configured to control the normal mode and the cold mode of the actuation mechanism.

18. The image capture apparatus of claim 17, wherein the heat generating component comprises a processor or an image sensor.

19. The image capture apparatus of claim 16, wherein the heat sensitive assembly comprises an image sensor or a battery.

20. The image capture apparatus of claim 19, further comprising:
    a heatsink thermal interface material configured to thermally couple the heatsink and the heat conductor in the normal mode; and
    a heat sensitive assembly thermal interface material configured to thermally couple the heat sensitive assembly and the heat conductor in the cold mode.

* * * * *